US011368167B2

(12) United States Patent
Chuggani et al.

(10) Patent No.: US 11,368,167 B2
(45) Date of Patent: Jun. 21, 2022

(54) ADDITIONAL COMPRESSION FOR EXISTING COMPRESSED DATA

(71) Applicant: NetApp Inc., Sunnyvale, CA (US)

(72) Inventors: Roopesh Chuggani, Bengaluru (IN); Rahul Thapliyal, Karnataka (IN)

(73) Assignee: NetApp Inc., San Jose, CA (US)

( * ) Notice: Subject to any disclaimer, the term of this patent is extended or adjusted under 35 U.S.C. 154(b) by 88 days.

(21) Appl. No.: 17/027,995

(22) Filed: Sep. 22, 2020

(65) Prior Publication Data

US 2021/0409037 A1 Dec. 30, 2021

(30) Foreign Application Priority Data

Jun. 26, 2020 (IN) .............................. 202041027165

(51) Int. Cl.
*H03M 7/00* (2006.01)
*H03M 7/30* (2006.01)
*G06F 3/06* (2006.01)

(52) U.S. Cl.
CPC .......... *H03M 7/6011* (2013.01); *G06F 3/064* (2013.01); *G06F 3/067* (2013.01); *G06F 3/0608* (2013.01); *G06F 3/0689* (2013.01); *H03M 7/6005* (2013.01)

(58) Field of Classification Search
CPC ............ H03M 7/6011; H03M 7/6005; H03M 7/3091; H03M 7/607; G06F 3/0608; G06F 3/064; G06F 3/067; G06F 3/0689
USPC ..................................................... 341/50, 51
See application file for complete search history.

(56) References Cited

U.S. PATENT DOCUMENTS

| 8,566,477 | B2* | 10/2013 | Demidov | H04N 19/40 382/233 |
|---|---|---|---|---|
| 8,578,058 | B2* | 11/2013 | Demidov | H03M 7/3077 375/240.25 |
| 8,898,337 | B2* | 11/2014 | Demidov | H03M 7/6088 375/240.03 |
| 10,025,820 | B2* | 7/2018 | Marwah | G06F 16/2455 |
| 10,044,370 | B1* | 8/2018 | Pasha. B. K. | H03M 7/6005 |
| 10,103,747 | B1* | 10/2018 | Pasha.B.K | H03M 7/30 |
| 10,715,175 | B2* | 7/2020 | Bannon | H03M 7/40 |
| 11,025,271 | B2* | 6/2021 | Sung | G06N 5/04 |
| 11,200,004 | B2* | 12/2021 | McIlroy | G06F 16/1744 |
| 2011/0225322 | A1* | 9/2011 | Demidov | H04N 19/70 709/247 |
| 2012/0045142 | A1* | 2/2012 | Demidov | H04N 19/40 382/246 |
| 2015/0227540 | A1* | 8/2015 | Lin | G06F 16/221 707/693 |
| 2019/0068217 | A1* | 2/2019 | Bannon | H03M 7/6005 |

* cited by examiner

*Primary Examiner* — Jean B Jeanglaude
(74) *Attorney, Agent, or Firm* — Cooper Legal Group, LLC

(57) ABSTRACT

Techniques are provided for implementing additional compression for existing compressed data. Format information stored within a data block is evaluated to determine whether the data block is compressed or uncompressed. In response to the data block being compressed according to a first compression format, the data block is decompressed using the format information. The data block is compressed with one or more other data blocks to create compressed data having a second compression format different than the first compression format.

20 Claims, 9 Drawing Sheets

ADDITIONAL COMPRESSION FOR EXISTING COMPRESSED DATA

RELATED APPLICATIONS

This application claims priority to India Patent Application, titled "ADDITIONAL COMPRESSION FOR EXISTING COMPRESSED DATA", filed on Jun. 26, 2020 and accorded Indian Application No.: 202041027165, which is incorporated herein by reference.

BACKGROUND

Many storage environments provide storage efficiency functionality for data stored on behalf of clients within the storage environments. For example a node of a storage environment (e.g., a server, a virtual machine, hardware, software, or combination thereof) may provide compression functionality for user data. The node may compress the user data so that less storage is consumed. In another example, the node may provide deduplication functionality for the user data. The node may deduplicate the user data in order to identify and eliminate redundantly stored data. In this way, the node may implement various types of storage efficiency functionality in order to more efficiently store data on behalf of clients.

DETAILED DESCRIPTION

Figure 1:
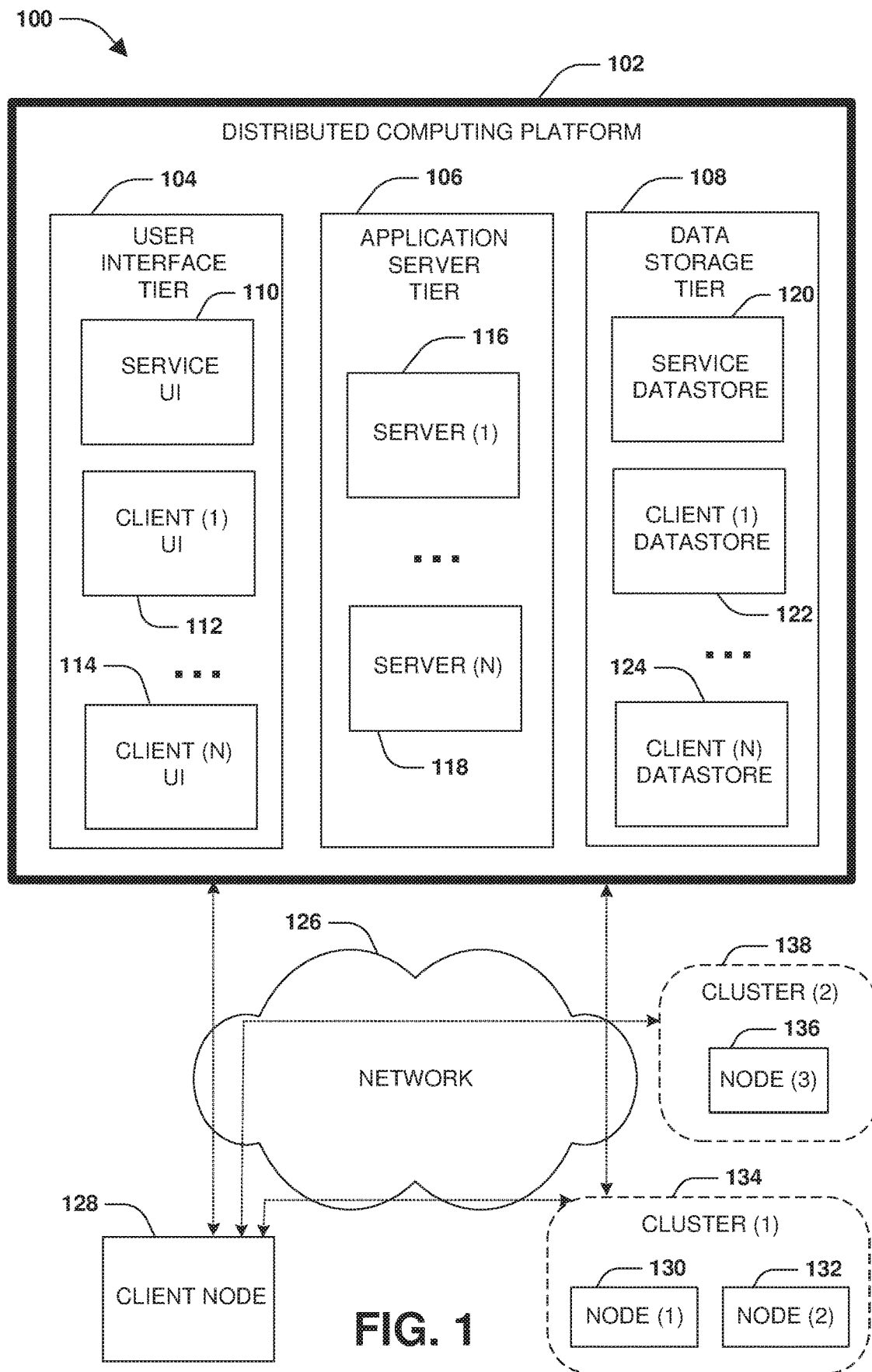
FIG. 1 is a block diagram illustrating an example computing environment in which an embodiment of the invention may be implemented.

Some examples of the claimed subject matter are now described with reference to the drawings, where like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. Nothing in this detailed description is admitted as prior art.

The techniques described herein are directed to providing additional compression for existing compressed data in order to achieve additional storage compression savings to reduce storage consumption. In particular, compressed data may have been compressed at an application or file level with a relatively lighter-weight compression algorithm that provides some storage compression savings. As provided herein, format information describing how to decompress the compressed data is used to decompress the compressed data, which is then recompressed at a storage layer or container layer level with one or more additional data blocks using a relatively heavier-weight compression algorithm and/or larger compression size. The relatively heavier-weight compression algorithm provides more storage compression savings than the relatively lighter-weight compression algorithm. In this way, storage consumption is reduced.

In an example, a node, such as a server, a computing device, a virtual machine, a storage service, hardware, software, or combination thereof, may store data on behalf of client devices. The node may also provide various types of storage efficiency functionality, such as deduplication, compression, etc. As provided herein, the node may provide additional compression for existing compressed data. That is, when data is written to a file within storage, the data may be compressed. In an example, the data may be compressed by an application accessing the file because the data is written to the file. In another example, the data may be compressed at a file level by combining some file blocks of the file (e.g., compression after the data is written to file blocks of the file on storage).

If an original compression format of the compressed data is known, such as by a file system or other functionality of the node, then additional compression storage savings can be achieved, as provided herein. The additional compression storage savings can be achieved by decompressing compressed data blocks as uncompressed data blocks. The uncompressed data blocks are then recompressed with one or more additional data blocks using a different compression format. For example, the uncompressed data blocks may be recompressed using a larger chunk size (e.g., a larger compression size encompassing the uncompressed data blocks along with the additional data blocks) and/or by using a heavier-weight compression algorithm compared to a lighter-weight compression algorithm that may have been originally used to compressed the compressed data blocks. In this way, additional storage savings can be achieved by decompressing the compressed data blocks as uncompressed data blocks, and then recompressing the uncompressed data blocks using a different compression algorithm and/or compression/chunk size than what was originally used to compress the compressed data blocks.

In order to decompress the compressed data blocks from the original compression format, format information of the compressed data blocks may be identified and used to decompress the compressed data blocks. The format information of the compressed data blocks may comprise information relating to a compression algorithm used to compress the compressed data blocks. The format information of the compressed data blocks may comprise other metadata that may have been stored along with the compressed data blocks, such as information relating to how to decompress the compressed data blocks. The format information comprises enough information to decompress the compressed data blocks, along with enough information to subsequently compress the data blocks back to the original compression formation, such as when the data blocks are to be read.

In another example of providing additional compression for data blocks, existing data blocks may be combined and compressed irrespective of whether the data blocks are compressed or not by an application and/or file system. The resulting combined and compressed data blocks may be comprised of data blocks that were not originally compressed and/or data blocks that were originally compressed. However, additional compression savings may be achieved, in some embodiments, when already compressed data blocks are first decompressed as uncompressed data blocks that are then combined and compressed with other data blocks for additional compression savings.

In an embodiment of providing additional compression for existing compressed data blocks, the node may implemented functionality through hardware and/or software to identify if an existing data block is already compressed or not by looking at format information stored within that data block (e.g., stored within a disk block of physical storage comprising data of the data block). In response to determining that the data block is a compressed data block based upon the format information, the compressed data block is decompressed using the format information to create an uncompressed data block. The uncompressed data block may be combined and/or (re)compressed with other data blocks to create recompressed data. This provides for additional compression storage savings because the recompressed data may be compressed in a manner that provides more storage savings than when the recompressed data was original compressed. This can be achieved by using a heavier-weight compression algorithm and/or a larger compression size. This recompression technique may be implemented in a manner that compresses data blocks in such a format that there is little to no negative impact upon deduplication savings (e.g., if the data was previously deduplicated) and/or data management functionality provided by a file system.

When recompressing the data blocks as the recompressed data blocks, additional information about the original format of original compression is stored so that when the data blocks (recompressed data blocks) are read back, the data blocks can be converted back to the original compression format (e.g., the recompressed data blocks are decompressed and then compressed into the original compression format) before processing an operation requesting the data blocks. This additional information may be stored with the recompressed data, such as at a start of a disk block of storage before the compressed data stored within the disk block (e.g., the additional information about the original compression format may be stored within a disk block along with the recompressed data being stored within that disk block). In an example, compressing the data blocks back into the original compression format may be avoided if after decompression as uncompressed data, the uncompressed data can be directly passed to a requestor (e.g., an application or file accessing the data blocks) along with information indicating that the uncompressed data has already been decompressed.

The techniques provided herein provide for the advantage of light-weight compression (e.g., less computation and resource intensive compression, but also less storage savings) to be initially performed at an application or file layer. Subsequently, heavier-weight compression (e.g., more computation and resource intensive compression, with more storage savings) may be performed at a storage layer to achieve improved compression savings. For example, the heavier-weight compression may be performed at a container file level, while the light-weight compression may have been performed at a user file or virtual volume layer. User file layer compression format information may be stored within a disk block comprising the compressed data, such as at a start of the compressed data. This user file layer compression format information may be used by container layer compression to decompress the data from an original compression format (e.g., compression by the light-weight compression) to obtain uncompressed data. The uncompressed data may be combined and/or compressed with other data blocks using the heavier-weight compression in order to compress a larger chunk of data than merely the uncompressed data. The heavier-weight compression uses a different compression algorithm than the light-weight compression algorithm used by the user file layer compression in order to provide the additional storage savings.

FIG. 1 is a diagram illustrating an example operating environment 100 in which an embodiment of the techniques described herein may be implemented. In one example, the techniques described herein may be implemented within a client device 128, such as a laptop, a tablet, a personal computer, a mobile device, a server, a virtual machine, a wearable device, etc. In another example, the techniques described herein may be implemented within one or more nodes, such as a first node 130 and/or a second node 132 within a first cluster 134, a third node 136 within a second cluster 138, etc. A node may comprise a storage controller, a server, an on-premise device, a virtual machine such as a storage virtual machine, hardware, software, or combination thereof. The one or more nodes may be configured to manage the storage and access to data on behalf of the client device 128 and/or other client devices. In another example, the techniques described herein may be implemented within a distributed computing platform 102 such as a cloud computing environment (e.g., a cloud storage environment, a multi-tenant platform, a hyperscale infrastructure comprising scalable server architectures and virtual networking, etc.) configured to manage the storage and access to data on behalf of client devices and/or nodes.

In yet another example, at least some of the techniques described herein are implemented across one or more of the client device 128, the one or more nodes 130, 132, and/or 136, and/or the distributed computing platform 102. For example, the client device 128 may transmit operations, such as data operations to read data and write data and metadata operations (e.g., a create file operation, a rename directory operation, a resize operation, a set attribute operation, etc.), over a network 126 to the first node 130 for implementation by the first node 130 upon storage. The first node 130 may store data associated with the operations within volumes or other data objects/structures hosted within locally attached storage, remote storage hosted by other computing devices accessible over the network 126, storage provided by the distributed computing platform 102, etc. The first node 130 may replicate the data and/or the operations to other computing devices, such as to the second node 132, the third node 136, a storage virtual machine executing within the distributed computing platform 102, etc., so that one or more replicas of the data are maintained. For example, the third node 136 may host a destination storage volume that is maintained as a replica of a source storage volume of the first node 130. Such replicas can be used for disaster recovery and failover.

In an embodiment, the techniques described herein are implemented by a storage operating system or are implemented by a separate module that interacts with the storage operating system. The storage operating system may be hosted by the client device, 128, a node, the distributed computing platform 102, or across a combination thereof. In an example, the storage operating system may execute within a storage virtual machine, a hyperscaler, or other computing environment. The storage operating system may implement a one or more file systems to logically organize data within storage devices as one or more storage objects and provide a logical/virtual representation of how the storage objects are organized on the storage devices (e.g., a file system tailored for block-addressable storage, a file system tailored for byte-addressable storage such as persistent memory). A storage object may comprise any logically definable storage element stored by the storage operating system (e.g., a volume stored by the first node 130, a cloud object stored by the distributed computing platform 102, etc.). Each storage object may be associated with a unique identifier that uniquely identifies the storage object. For example, a volume may be associated with a volume identifier uniquely identifying that volume from other volumes. The storage operating system also manages client access to the storage objects.

The storage operating system may implement a file system for logically organizing data. For example, the storage operating system may implement a write anywhere file layout for a volume where modified data for a file may be written to any available location as opposed to a write-in-place architecture where modified data is written to the original location, thereby overwriting the previous data. In an example, the file system may be implemented through a file system layer that stores data of the storage objects in an on-disk format representation that is block-based (e.g., data is stored within 4 kilobyte blocks and inodes are used to identify files and file attributes such as creation time, access permissions, size and block location, etc.).

In an example, deduplication may be implemented by a deduplication module associated with the storage operating system. Deduplication is performed to improve storage efficiency. One type of deduplication is inline deduplication that ensures blocks are deduplicated before being written to a storage device. Inline deduplication uses a data structure, such as an incore hash store, which maps fingerprints of data to data blocks of the storage device storing the data. Whenever data is to be written to the storage device, a fingerprint of that data is calculated and the data structure is looked up using the fingerprint to find duplicates (e.g., potentially duplicate data already stored within the storage device). If duplicate data is found, then the duplicate data is loaded from the storage device and a byte by byte comparison may be performed to ensure that the duplicate data is an actual duplicate of the data to be written to the storage device. If the data to be written is a duplicate of the loaded duplicate data, then the data to be written to disk is not redundantly stored to the storage device. Instead, a pointer or other reference is stored in the storage device in place of the data to be written to the storage device. The pointer points to the duplicate data already stored in the storage device. A reference count for the data may be incremented to indicate that the pointer now references the data. If at some point the pointer no longer references the data (e.g., the deduplicated data is deleted and thus no longer references the data in the storage device), then the reference count is decremented. In this way, inline deduplication is able to deduplicate data before the data is written to disk. This improves the storage efficiency of the storage device.

Background deduplication is another type of deduplication that deduplicates data already written to a storage device. Various types of background deduplication may be implemented. In an example of background deduplication, data blocks that are duplicated between files are rearranged within storage units such that one copy of the data occupies physical storage. References to the single copy can be inserted into a file system structure such that all files or containers that contain the data refer to the same instance of the data. Deduplication can be performed on a data storage device block basis. In an example, data blocks on a storage device can be identified using a physical volume block number. The physical volume block number uniquely identifies a particular block on the storage device. Additionally, blocks within a file can be identified by a file block number. The file block number is a logical block number that indicates the logical position of a block within a file relative to other blocks in the file. For example, file block number 0 represents the first block of a file, file block number 1 represents the second block, etc. File block numbers can be mapped to a physical volume block number that is the actual data block on the storage device. During deduplication operations, blocks in a file that contain the same data are deduplicated by mapping the file block number for the block to the same physical volume block number, and maintaining a reference count of the number of file block numbers that map to the physical volume block number. For example, assume that file block number 0 and file block number 5 of a file contain the same data, while file block numbers 1-4 contain unique data. File block numbers 1-4 are mapped to different physical volume block numbers. File block number 0 and file block number 5 may be mapped to the same physical volume block number, thereby reducing storage requirements for the file. Similarly, blocks in different files that contain the same data can be mapped to the same physical volume block number. For example, if file block number 0 of file A contains the same data as file block number 3 of file B, file block number 0 of file A may be mapped to the same physical volume block number as file block number 3 of file B.

In another example of background deduplication, a changelog is utilized to track blocks that are written to the storage device. Background deduplication also maintains a fingerprint database (e.g., a flat metafile) that tracks all unique block data such as by tracking a fingerprint and other filesystem metadata associated with block data. Background deduplication can be periodically executed or triggered based upon an event such as when the changelog fills beyond a threshold. As part of background deduplication, data in both the changelog and the fingerprint database is sorted based upon fingerprints. This ensures that all duplicates are sorted next to each other. The duplicates are moved to a dup file. The unique changelog entries are moved to the fingerprint database, which will serve as duplicate data for a next deduplication operation. In order to optimize certain filesystem operations needed to deduplicate a block, duplicate records in the dup file are sorted in certain filesystem sematic order (e.g., inode number and block number). Next, the duplicate data is loaded from the storage device and a whole block byte by byte comparison is performed to make sure duplicate data is an actual duplicate of the data to be written to the storage device. After, the block in the changelog is modified to point directly to the duplicate data as opposed to redundantly storing data of the block.

In an example, deduplication operations performed by a data deduplication layer of a node can be leveraged for use on another node during data replication operations. For example, the first node 130 may perform deduplication operations to provide for storage efficiency with respect to data stored on a storage volume. The benefit of the deduplication operations performed on first node 130 can be provided to the second node 132 with respect to the data on first node 130 that is replicated to the second node 132. In some aspects, a data transfer protocol, referred to as the LRSE (Logical Replication for Storage Efficiency) protocol, can be used as part of replicating consistency group differences from the first node 130 to the second node 132. In the LRSE protocol, the second node 132 maintains a history buffer that keeps track of data blocks that it has previously received. The history buffer tracks the physical volume block numbers and file block numbers associated with the data blocks that have been transferred from first node 130 to the second node 132. A request can be made of the first node 130 to not transfer blocks that have already been transferred. Thus, the second node 132 can receive deduplicated data from the first node 130, and will not need to perform deduplication operations on the deduplicated data replicated from first node 130.

In an example, the first node 130 may preserve deduplication of data that is transmitted from first node 130 to the distributed computing platform 102. For example, the first node 130 may create an object comprising deduplicated data. The object is transmitted from the first node 130 to the distributed computing platform 102 for storage. In this way, the object within the distributed computing platform 102 maintains the data in a deduplicated state. Furthermore, deduplication may be preserved when deduplicated data is transmitted/replicated/mirrored between the client device 128, the first node 130, the distributed computing platform 102, and/or other nodes or devices.

In an example, compression may be implemented by a compression module associated with the storage operating system. The compression module may utilize various types of compression techniques to replace longer sequences of data (e.g., frequently occurring and/or redundant sequences) with shorter sequences, such as by using Huffman coding, arithmetic coding, compression dictionaries, etc. For example, an decompressed portion of a file may comprise "ggggnnnnnnnqqqqqqqqqq", which is compressed to become "4g6n10q". In this way, the size of the file can be reduced to improve storage efficiency. Compression may be implemented for compression groups. A compression group may correspond to a compressed group of blocks. The compression group may be represented by virtual volume block numbers. The compression group may comprise contiguous or non-contiguous blocks.

Compression may be preserved when compressed data is transmitted/replicated/mirrored between the client device 128, a node, the distributed computing platform 102, and/or other nodes or devices. For example, an object may be created by the first node 130 to comprise compressed data. The object is transmitted from the first node 130 to the distributed computing platform 102 for storage. In this way, the object within the distributed computing platform 102 maintains the data in a compressed state.

In an example, various types of synchronization may be implemented by a synchronization module associated with the storage operating system. In an example, synchronous replication may be implemented, such as between the first node 130 and the second node 132. It may be appreciated that the synchronization module may implement synchronous replication between any devices within the operating environment 100, such as between the first node 130 of the first cluster 134 and the third node 136 of the second cluster 138 and/or between a node of a cluster and an instance of a node or virtual machine in the distributed computing platform 102.

As an example, during synchronous replication, the first node 130 may receive a write operation from the client device 128. The write operation may target a file stored within a volume managed by the first node 130. The first node 130 replicates the write operation to create a replicated write operation. The first node 130 locally implements the write operation upon the file within the volume. The first node 130 also transmits the replicated write operation to a synchronous replication target, such as the second node 132 that maintains a replica volume as a replica of the volume maintained by the first node 130. The second node 132 will execute the replicated write operation upon the replica volume so that the file within the volume and the replica volume comprises the same data. After, the second node 132 will transmit a success message to the first node 130. With synchronous replication, the first node 130 does not respond with a success message to the client device 128 for the write operation until both the write operation is executed upon the volume and the first node 130 receives the success message that the second node 132 executed the replicated write operation upon the replica volume.

In another example, asynchronous replication may be implemented, such as between the first node 130 and the third node 136. It may be appreciated that the synchronization module may implement asynchronous replication between any devices within the operating environment 100, such as between the first node 130 of the first cluster 134 and the distributed computing platform 102. In an example, the first node 130 may establish an asynchronous replication relationship with the third node 136. The first node 130 may capture a baseline snapshot of a first volume as a point in time representation of the first volume. The first node 130 may utilize the baseline snapshot to perform a baseline transfer of the data within the first volume to the third node 136 in order to create a second volume within the third node 136 comprising data of the first volume as of the point in time at which the baseline snapshot was created.

After the baseline transfer, the first node 130 may subsequently create snapshots of the first volume over time. As part of asynchronous replication, an incremental transfer is performed between the first volume and the second volume. In particular, a snapshot of the first volume is created. The snapshot is compared with a prior snapshot that was previously used to perform the last asynchronous transfer (e.g., the baseline transfer or a prior incremental transfer) of data to identify a difference in data of the first volume between the snapshot and the prior snapshot (e.g., changes to the first volume since the last asynchronous transfer). Accordingly, the difference in data is incrementally transferred from the first volume to the second volume. In this way, the second volume will comprise the same data as the first volume as of the point in time when the snapshot was created for performing the incremental transfer. It may be appreciated that other types of replication may be implemented, such as semi-sync replication.

In an embodiment, the first node 130 may store data or a portion thereof within storage hosted by the distributed computing platform 102 by transmitting the data within objects to the distributed computing platform 102. In one example, the first node 130 may locally store frequently accessed data within locally attached storage. Less frequently accessed data may be transmitted to the distributed computing platform 102 for storage within a data storage tier 108. The data storage tier 108 may store data within a service data store 120, and may store client specific data within client data stores assigned to such clients such as a client (1) data store 122 used to store data of a client (1) and a client (N) data store 124 used to store data of a client (N). The data stores may be physical storage devices or may be defined as logical storage, such as a virtual volume, LUNs, or other logical organizations of data that can be defined across one or more physical storage devices. In another example, the first node 130 transmits and stores all client data to the distributed computing platform 102. In yet another example, the client device 128 transmits and stores the data directly to the distributed computing platform 102 without the use of the first node 130.

The management of storage and access to data can be performed by one or more storage virtual machines (SVMs) or other storage applications that provide software as a service (SaaS) such as storage software services. In one example, an SVM may be hosted within the client device 128, within the first node 130, or within the distributed computing platform 102 such as by the application server tier 106. In another example, one or more SVMs may be hosted across one or more of the client device 128, the first node 130, and the distributed computing platform 102. The one or more SVMs may host instances of the storage operating system.

In an example, the storage operating system may be implemented for the distributed computing platform 102. The storage operating system may allow client devices to access data stored within the distributed computing platform 102 using various types of protocols, such as a Network File System (NFS) protocol, a Server Message Block (SMB) protocol and Common Internet File System (CIFS), and Internet Small Computer Systems Interface (iSCSI), and/or other protocols. The storage operating system may provide various storage services, such as disaster recovery (e.g., the ability to non-disruptively transition client devices from accessing a primary node that has failed to a secondary node that is taking over for the failed primary node), backup and archive function, replication such as asynchronous and/or synchronous replication, deduplication, compression, high availability storage, cloning functionality (e.g., the ability to clone a volume, such as a space efficient flex clone), snapshot functionality (e.g., the ability to create snapshots and restore data from snapshots), data tiering (e.g., migrating infrequently accessed data to slower/cheaper storage), encryption, managing storage across various platforms such as between on-premise storage systems and multiple cloud systems, etc.

In one example of the distributed computing platform 102, one or more SVMs may be hosted by the application server tier 106. For example, a server (1) 116 is configured to host SVMs used to execute applications such as storage applications that manage the storage of data of the client (1) within the client (1) data store 122. Thus, an SVM executing on the server (1) 116 may receive data and/or operations from the client device 128 and/or the first node 130 over the network 126. The SVM executes a storage application and/or an instance of the storage operating system to process the operations and/or store the data within the client (1) data store 122. The SVM may transmit a response back to the client device 128 and/or the first node 130 over the network 126, such as a success message or an error message. In this way, the application server tier 106 may host SVMs, services, and/or other storage applications using the server (1) 116, the server (N) 118, etc.

A user interface tier 104 of the distributed computing platform 102 may provide the client device 128 and/or the first node 130 with access to user interfaces associated with the storage and access of data and/or other services provided by the distributed computing platform 102. In an example, a service user interface 110 may be accessible from the distributed computing platform 102 for accessing services subscribed to by clients and/or nodes, such as data replication services, application hosting services, data security services, human resource services, warehouse tracking services, accounting services, etc. For example, client user interfaces may be provided to corresponding clients, such as a client (1) user interface 112, a client (N) user interface 114, etc. The client (1) can access various services and resources subscribed to by the client (1) through the client (1) user interface 112, such as access to a web service, a development environment, a human resource application, a warehouse tracking application, and/or other services and resources provided by the application server tier 106, which may use data stored within the data storage tier 108.

The client device 128 and/or the first node 130 may subscribe to certain types and amounts of services and resources provided by the distributed computing platform 102. For example, the client device 128 may establish a subscription to have access to three virtual machines, a certain amount of storage, a certain type/amount of data redundancy, a certain type/amount of data security, certain service level agreements (SLAs) and service level objectives (SLOs), latency guarantees, bandwidth guarantees, access to execute or host certain applications, etc. Similarly, the first node 130 can establish a subscription to have access to certain services and resources of the distributed computing platform 102.

As shown, a variety of clients, such as the client device 128 and the first node 130, incorporating and/or incorporated into a variety of computing devices may communicate with the distributed computing platform 102 through one or more networks, such as the network 126. For example, a client may incorporate and/or be incorporated into a client application (e.g., software) implemented at least in part by one or more of the computing devices.

Examples of suitable computing devices include personal computers, server computers, desktop computers, nodes, storage servers, nodes, laptop computers, notebook computers, tablet computers or personal digital assistants (PDAs), smart phones, cell phones, and consumer electronic devices incorporating one or more computing device components, such as one or more electronic processors, microprocessors, central processing units (CPU), or controllers. Examples of suitable networks include networks utilizing wired and/or wireless communication technologies and networks operating in accordance with any suitable networking and/or communication protocol (e.g., the Internet). In use cases involving the delivery of customer support services, the computing devices noted represent the endpoint of the customer support delivery process, i.e., the consumer's device.

The distributed computing platform 102, such as a multi-tenant business data processing platform or cloud computing environment, may include multiple processing tiers, including the user interface tier 104, the application server tier 106, and a data storage tier 108. The user interface tier 104 may maintain multiple user interfaces, including graphical user interfaces and/or web-based interfaces. The user interfaces may include the service user interface 110 for a service to provide access to applications and data for a client (e.g., a "tenant") of the service, as well as one or more user interfaces that have been specialized/customized in accordance with user specific requirements (e.g., as discussed above), which may be accessed via one or more APIs.

The service user interface 110 may include components enabling a tenant to administer the tenant's participation in the functions and capabilities provided by the distributed computing platform 102, such as accessing data, causing execution of specific data processing operations, etc. Each processing tier may be implemented with a set of computers, virtualized computing environments such as a storage virtual machine or storage virtual server, and/or computer components including computer servers and processors, and may perform various functions, methods, processes, or operations as determined by the execution of a software application or set of instructions.

The data storage tier 108 may include one or more data stores, which may include the service data store 120 and one or more client data stores 122-124. Each client data store may contain tenant-specific data that is used as part of providing a range of tenant-specific business and storage services or functions, including but not limited to ERP, CRM, eCommerce, Human Resources management, payroll, storage services, etc. Data stores may be implemented with any suitable data storage technology, including structured query language (SQL) based relational database management systems (RDBMS), file systems hosted by operating systems, object storage, etc.

The distributed computing platform 102 may be a multi-tenant and service platform operated by an entity in order to provide multiple tenants with a set of business related applications, data storage, and functionality. These applications and functionality may include ones that a business uses to manage various aspects of its operations. For example, the applications and functionality may include providing web-based access to business information systems, thereby allowing a user with a browser and an Internet or intranet connection to view, enter, process, or modify certain types of business information or any other type of information.

Figure 2:
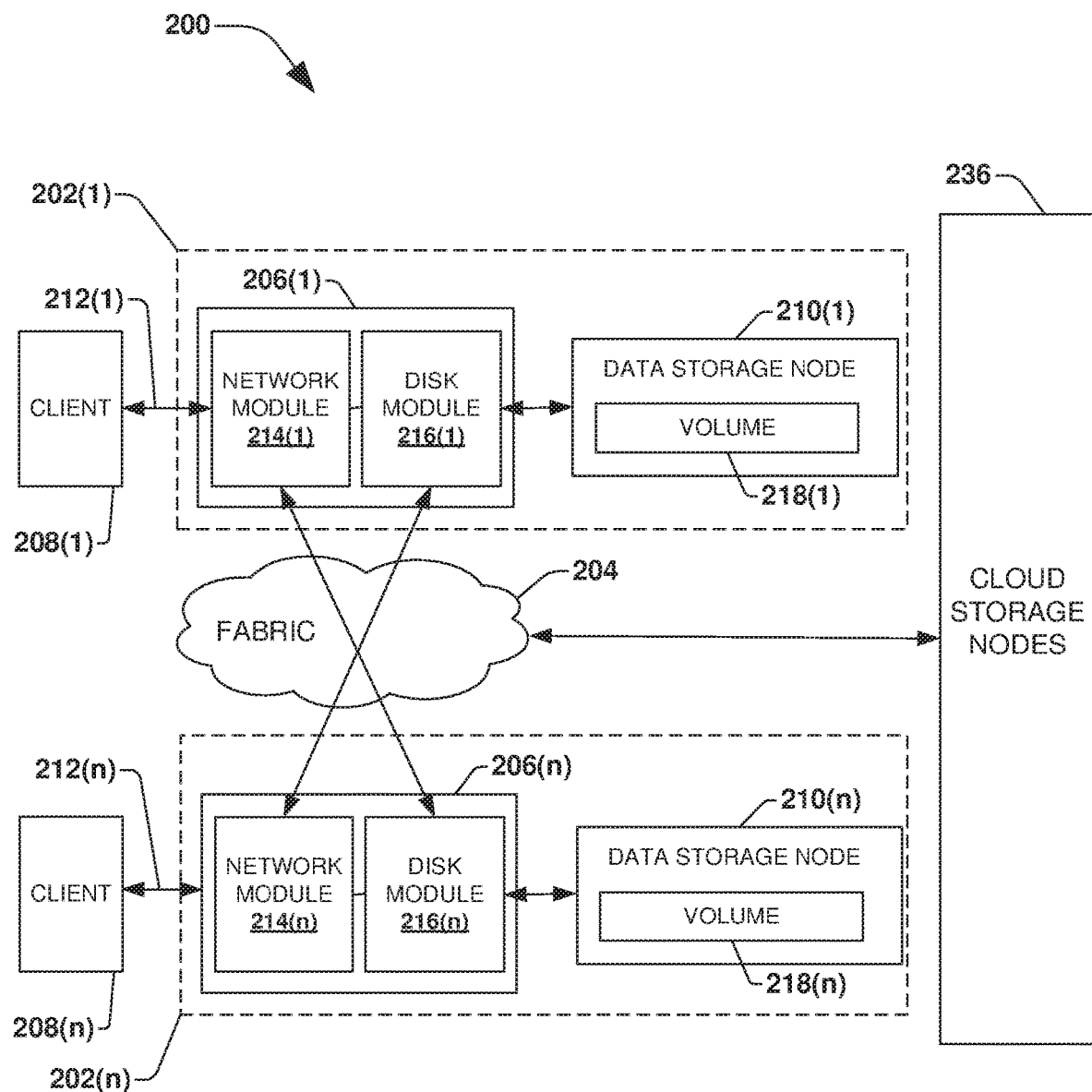
FIG. 2 is a block diagram illustrating a network environment with exemplary node computing devices.

A clustered network environment 200 that may implement one or more aspects of the techniques described and illustrated herein is shown in FIG. 2. The clustered network environment 200 includes data storage apparatuses 202(1)-202(n) that are coupled over a cluster or cluster fabric 204 that includes one or more communication network(s) and facilitates communication between the data storage apparatuses 202(1)-202(n) (and one or more modules, components, etc. therein, such as, node computing devices 206(1)-206(n), for example), although any number of other elements or components can also be included in the clustered network environment 200 in other examples. This technology provides a number of advantages including methods, non-transitory computer readable media, and computing devices that implement the techniques described herein.

In this example, node computing devices 206(1)-206(n) can be primary or local storage controllers or secondary or remote storage controllers that provide client devices 208(1)-208(n) with access to data stored within data storage devices 210(1)-210(n) and cloud storage device(s) 236 (also referred to as cloud storage node(s)). The node computing devices 206(1)-206(n) may be implemented as hardware, software (e.g., a storage virtual machine), or combination thereof.

The data storage apparatuses 202(1)-202(n) and/or node computing devices 206(1)-206(n) of the examples described and illustrated herein are not limited to any particular geographic areas and can be clustered locally and/or remotely via a cloud network, or not clustered in other examples. Thus, in one example the data storage apparatuses 202(1)-202(n) and/or node computing device 206(1)-206(n) can be distributed over a plurality of storage systems located in a plurality of geographic locations (e.g., located on-premise, located within a cloud computing environment, etc.); while in another example a clustered network can include data storage apparatuses 202(1)-202(n) and/or node computing device 206(1)-206(n) residing in a same geographic location (e.g., in a single on-site rack).

In the illustrated example, one or more of the client devices 208(1)-208(n), which may be, for example, personal computers (PCs), computing devices used for storage (e.g., storage servers), or other computers or peripheral devices, are coupled to the respective data storage apparatuses 202(1)-202(n) by network connections 212(1)-212(n). Network connections 212(1)-212(n) may include a local area network (LAN) or wide area network (WAN) (i.e., a cloud network), for example, that utilize TCP/IP and/or one or more Network Attached Storage (NAS) protocols, such as a Common Internet Filesystem (CIFS) protocol or a Network Filesystem (NFS) protocol to exchange data packets, a Storage Area Network (SAN) protocol, such as Small Computer System Interface (SCSI) or Fiber Channel Protocol (FCP), an object protocol, such as simple storage service (S3), and/or non-volatile memory express (NVMe), for example.

Illustratively, the client devices 208(1)-208(n) may be general-purpose computers running applications and may interact with the data storage apparatuses 202(1)-202(n) using a client/server model for exchange of information. That is, the client devices 208(1)-208(n) may request data from the data storage apparatuses 202(1)-202(n) (e.g., data on one of the data storage devices 210(1)-210(n) managed by a network storage controller configured to process I/O commands issued by the client devices 208(1)-208(n)), and the data storage apparatuses 202(1)-202(n) may return results of the request to the client devices 208(1)-208(n) via the network connections 212(1)-212(n).

The node computing devices 206(1)-206(n) of the data storage apparatuses 202(1)-202(n) can include network or host nodes that are interconnected as a cluster to provide data storage and management services, such as to an enterprise having remote locations, cloud storage (e.g., a storage endpoint may be stored within cloud storage device(s) 236), etc., for example. Such node computing devices 206(1)-206(n) can be attached to the cluster fabric 204 at a connection point, redistribution point, or communication endpoint, for example. One or more of the node computing devices 206(1)-206(n) may be capable of sending, receiving, and/or forwarding information over a network communications channel, and could comprise any type of device that meets any or all of these criteria.

In an example, the node computing devices 206(1) and 206(n) may be configured according to a disaster recovery configuration whereby a surviving node provides switchover access to the storage devices 210(1)-210(n) in the event a disaster occurs at a disaster storage site (e.g., the node computing device 206(1) provides client device 212(n) with switchover data access to data storage devices 210(n) in the event a disaster occurs at the second storage site). In other examples, the node computing device 206(n) can be configured according to an archival configuration and/or the node computing devices 206(1)-206(n) can be configured based on another type of replication arrangement (e.g., to facilitate load sharing). Additionally, while two node computing devices are illustrated in FIG. 2, any number of node computing devices or data storage apparatuses can be included in other examples in other types of configurations or arrangements.

As illustrated in the clustered network environment 200, node computing devices 206(1)-206(n) can include various functional components that coordinate to provide a distributed storage architecture. For example, the node computing devices 206(1)-206(n) can include network modules 214(1)-214(n) and disk modules 216(1)-216(n). Network modules 214(1)-214(n) can be configured to allow the node computing devices 206(1)-206(n) (e.g., network storage controllers) to connect with client devices 208(1)-208(n) over the storage network connections 212(1)-212(n), for example, allowing the client devices 208(1)-208(n) to access data stored in the clustered network environment 200.

Further, the network modules 214(1)-214(n) can provide connections with one or more other components through the cluster fabric 204. For example, the network module 214(1) of node computing device 206(1) can access the data storage device 210(n) by sending a request via the cluster fabric 204 through the disk module 216(n) of node computing device 206(n) when the node computing device 206(n) is available. Alternatively, when the node computing device 206(n) fails, the network module 214(1) of node computing device 206(1) can access the data storage device 210(n) directly via the cluster fabric 204. The cluster fabric 204 can include one or more local and/or wide area computing networks (i.e., cloud networks) embodied as Infiniband, Fibre Channel (FC), or Ethernet networks, for example, although other types of networks supporting other protocols can also be used.

Disk modules 216(1)-216(n) can be configured to connect data storage devices 210(1)-210(n), such as disks or arrays of disks, SSDs, flash memory, or some other form of data storage, to the node computing devices 206(1)-206(n). Often, disk modules 216(1)-216(n) communicate with the data storage devices 210(1)-210(n) according to the SAN protocol, such as SCSI or FCP, for example, although other protocols can also be used. Thus, as seen from an operating system on node computing devices 206(1)-206(n), the data storage devices 210(1)-210(n) can appear as locally attached. In this manner, different node computing devices 206(1)-206(n), etc. may access data blocks, files, or objects through the operating system, rather than expressly requesting abstract files.

While the clustered network environment 200 illustrates an equal number of network modules 214(1)-214(n) and disk modules 216(1)-216(n), other examples may include a differing number of these modules. For example, there may be a plurality of network and disk modules interconnected in a cluster that do not have a one-to-one correspondence between the network and disk modules. That is, different node computing devices can have a different number of network and disk modules, and the same node computing device can have a different number of network modules than disk modules.

Further, one or more of the client devices 208(1)-208(n) can be networked with the node computing devices 206(1)-206(n) in the cluster, over the storage connections 212(1)-212(n). As an example, respective client devices 208(1)-208(n) that are networked to a cluster may request services (e.g., exchanging of information in the form of data packets) of node computing devices 206(1)-206(n) in the cluster, and the node computing devices 206(1)-206(n) can return results of the requested services to the client devices 208(1)-208(n). In one example, the client devices 208(1)-208(n) can exchange information with the network modules 214(1)-214(n) residing in the node computing devices 206(1)-206(n) (e.g., network hosts) in the data storage apparatuses 202(1)-202(n).

In one example, the storage apparatuses 202(1)-202(n) host aggregates corresponding to physical local and remote data storage devices, such as local flash or disk storage in the data storage devices 210(1)-210(n), for example. One or more of the data storage devices 210(1)-210(n) can include mass storage devices, such as disks of a disk array. The disks may comprise any type of mass storage devices, including but not limited to magnetic disk drives, flash memory, and any other similar media adapted to store information, including, for example, data and/or parity information.

The aggregates include volumes 218(1)-218(n) in this example, although any number of volumes can be included in the aggregates. The volumes 218(1)-218(n) are virtual data stores or storage objects that define an arrangement of storage and one or more filesystems within the clustered network environment 200. Volumes 218(1)-218(n) can span a portion of a disk or other storage device, a collection of disks, or portions of disks, for example, and typically define an overall logical arrangement of data storage. In one example volumes 218(1)-218(n) can include stored user data as one or more files, blocks, or objects that may reside in a hierarchical directory structure within the volumes 218(1)-218(n).

Volumes 218(1)-218(n) are typically configured in formats that may be associated with particular storage systems, and respective volume formats typically comprise features that provide functionality to the volumes 218(1)-218(n), such as providing the ability for volumes 218(1)-218(n) to form clusters, among other functionality. Optionally, one or more of the volumes 218(1)-218(n) can be in composite aggregates and can extend between one or more of the data storage devices 210(1)-210(n) and one or more of the cloud storage device(s) 236 to provide tiered storage, for example, and other arrangements can also be used in other examples.

In one example, to facilitate access to data stored on the disks or other structures of the data storage devices 210(1)-210(n), a filesystem may be implemented that logically organizes the information as a hierarchical structure of directories and files. In this example, respective files may be implemented as a set of disk blocks of a particular size that are configured to store information, whereas directories may be implemented as specially formatted files in which information about other files and directories are stored.

Data can be stored as files or objects within a physical volume and/or a virtual volume, which can be associated with respective volume identifiers. The physical volumes correspond to at least a portion of physical storage devices, such as the data storage devices 210(1)-210(n) (e.g., a Redundant Array of Independent (or Inexpensive) Disks (RAID system)) whose address, addressable space, location, etc. does not change. Typically the location of the physical volumes does not change in that the range of addresses used to access it generally remains constant.

Virtual volumes, in contrast, can be stored over an aggregate of disparate portions of different physical storage devices. Virtual volumes may be a collection of different available portions of different physical storage device locations, such as some available space from disks, for example. It will be appreciated that since the virtual volumes are not "tied" to any one particular storage device, virtual volumes can be said to include a layer of abstraction or virtualization, which allows it to be resized and/or flexible in some regards.

Further, virtual volumes can include one or more logical unit numbers (LUNs), directories, Qtrees, files, and/or other storage objects, for example. Among other things, these features, but more particularly the LUNs, allow the disparate memory locations within which data is stored to be identified, for example, and grouped as data storage unit. As such, the LUNs may be characterized as constituting a virtual disk or drive upon which data within the virtual volumes is stored within an aggregate. For example, LUNs are often referred to as virtual drives, such that they emulate a hard drive, while they actually comprise data blocks stored in various parts of a volume.

In one example, the data storage devices 210(1)-210(n) can have one or more physical ports, wherein each physical port can be assigned a target address (e.g., SCSI target address). To represent respective volumes, a target address on the data storage devices 210(1)-210(n) can be used to identify one or more of the LUNs. Thus, for example, when one of the node computing devices 206(1)-206(n) connects to a volume, a connection between the one of the node computing devices 206(1)-206(n) and one or more of the LUNs underlying the volume is created.

Respective target addresses can identify multiple of the LUNs, such that a target address can represent multiple volumes. The I/O interface, which can be implemented as circuitry and/or software in a storage adapter or as executable code residing in memory and executed by a processor, for example, can connect to volumes by using one or more addresses that identify the one or more of the LUNs.

Figure 3:
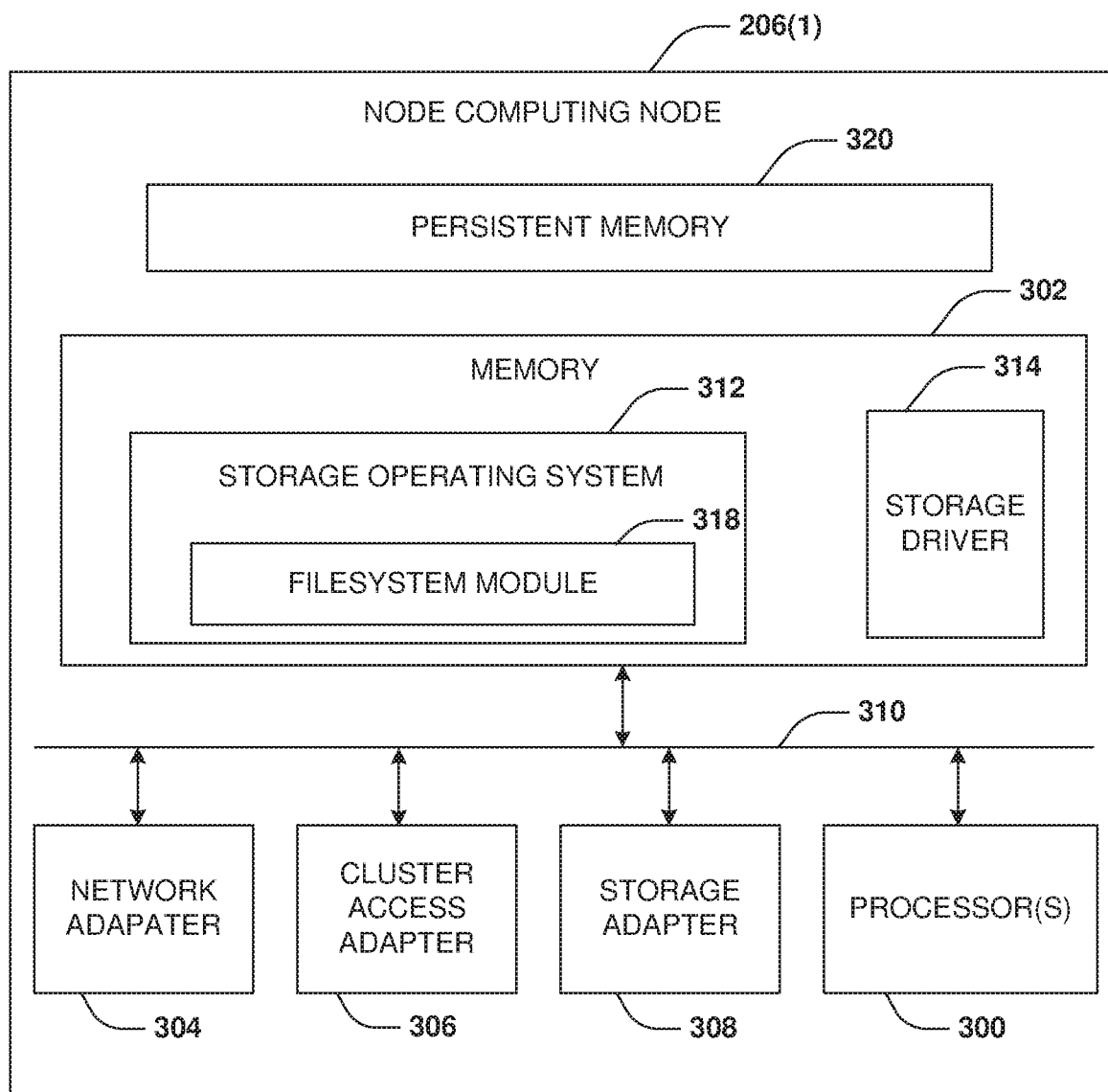
FIG. 3 is a block diagram illustrating an exemplary node computing device.

Referring to FIG. 3, node computing device 206(1) in this particular example includes processor(s) 300, a memory 302, a network adapter 304, a cluster access adapter 306, and a storage adapter 308 interconnected by a system bus 310. In other examples, the node computing device 206(1) comprises a virtual machine, such as a virtual storage machine. The node computing device 206(1) also includes a storage operating system 312 installed in the memory 302 that can, for example, implement a RAID data loss protection and recovery scheme to optimize reconstruction of data of a failed disk or drive in an array, along with other functionality such as deduplication, compression, snapshot creation, data mirroring, synchronous replication, asynchronous replication, encryption, etc. In some examples, the node computing device 206(n) is substantially the same in structure and/or operation as node computing device 206(1), although the node computing device 206(n) can also include a different structure and/or operation in one or more aspects than the node computing device 206(1). In an example, a file system may be implemented for persistent memory.

The network adapter 304 in this example includes the mechanical, electrical and signaling circuitry needed to connect the node computing device 206(1) to one or more of the client devices 208(1)-208(n) over network connections 212(1)-212(n), which may comprise, among other things, a point-to-point connection or a shared medium, such as a local area network. In some examples, the network adapter 304 further communicates (e.g., using TCP/IP) via the cluster fabric 204 and/or another network (e.g. a WAN) (not shown) with cloud storage device(s) 236 to process storage operations associated with data stored thereon.

The storage adapter 308 cooperates with the storage operating system 312 executing on the node computing device 206(1) to access information requested by one of the client devices 208(1)-208(n) (e.g., to access data on a data storage device 210(1)-210(n) managed by a network storage controller). The information may be stored on any type of attached array of writeable media such as magnetic disk drives, flash memory, and/or any other similar media adapted to store information.

In the exemplary data storage devices 210(1)-210(n), information can be stored in data blocks on disks. The storage adapter 308 can include I/O interface circuitry that couples to the disks over an I/O interconnect arrangement, such as a storage area network (SAN) protocol (e.g., Small Computer System Interface (SCSI), Internet SCSI (iSCSI), hyperSCSI, Fiber Channel Protocol (FCP)). The information is retrieved by the storage adapter 308 and, if necessary, processed by the processor(s) 300 (or the storage adapter 308 itself) prior to being forwarded over the system bus 310 to the network adapter 304 (and/or the cluster access adapter 306 if sending to another node computing device in the cluster) where the information is formatted into a data packet and returned to a requesting one of the client devices 208(1)-208(n) and/or sent to another node computing device attached via the cluster fabric 204. In some examples, a storage driver 314 in the memory 302 interfaces with the storage adapter to facilitate interactions with the data storage devices 210(1)-210(n).

The storage operating system 312 can also manage communications for the node computing device 206(1) among other devices that may be in a clustered network, such as attached to a cluster fabric 204. Thus, the node computing device 206(1) can respond to client device requests to manage data on one of the data storage devices 210(1)-210(n) or cloud storage device(s) 236 (e.g., or additional clustered devices) in accordance with the client device requests.

The file system module 318 of the storage operating system 312 can establish and manage one or more filesystems including software code and data structures that implement a persistent hierarchical namespace of files and directories, for example. As an example, when a new data storage device (not shown) is added to a clustered network system, the file system module 318 is informed where, in an existing directory tree, new files associated with the new data storage device are to be stored. This is often referred to as "mounting" a filesystem.

In the example node computing device 206(1), memory 302 can include storage locations that are addressable by the processor(s) 300 and adapters 304, 306, and 308 for storing related software application code and data structures. The processor(s) 300 and adapters 304, 306, and 308 may, for example, include processing elements and/or logic circuitry configured to execute the software code and manipulate the data structures.

In the example, the node computing device 206(1) comprises persistent memory 320. The persistent memory 320 comprises a plurality of pages within which data can be stored. The plurality of pages may be indexed by page block numbers.

The storage operating system 312, portions of which are typically resident in the memory 302 and executed by the processor(s) 300, invokes storage operations in support of a file service implemented by the node computing device 206(1). Other processing and memory mechanisms, including various computer readable media, may be used for storing and/or executing application instructions pertaining to the techniques described and illustrated herein. For example, the storage operating system 312 can also utilize one or more control files (not shown) to aid in the provisioning of virtual machines.

In this particular example, the memory 302 also includes a module configured to implement the techniques described herein, as discussed above and further below.

The examples of the technology described and illustrated herein may be embodied as one or more non-transitory computer or machine readable media, such as the memory 302, having machine or processor-executable instructions stored thereon for one or more aspects of the present technology, which when executed by processor(s), such as processor(s) 300, cause the processor(s) to carry out the steps necessary to implement the methods of this technology, as described and illustrated with the examples herein. In some examples, the executable instructions are configured to perform one or more steps of a method described and illustrated later.

Figure 4:
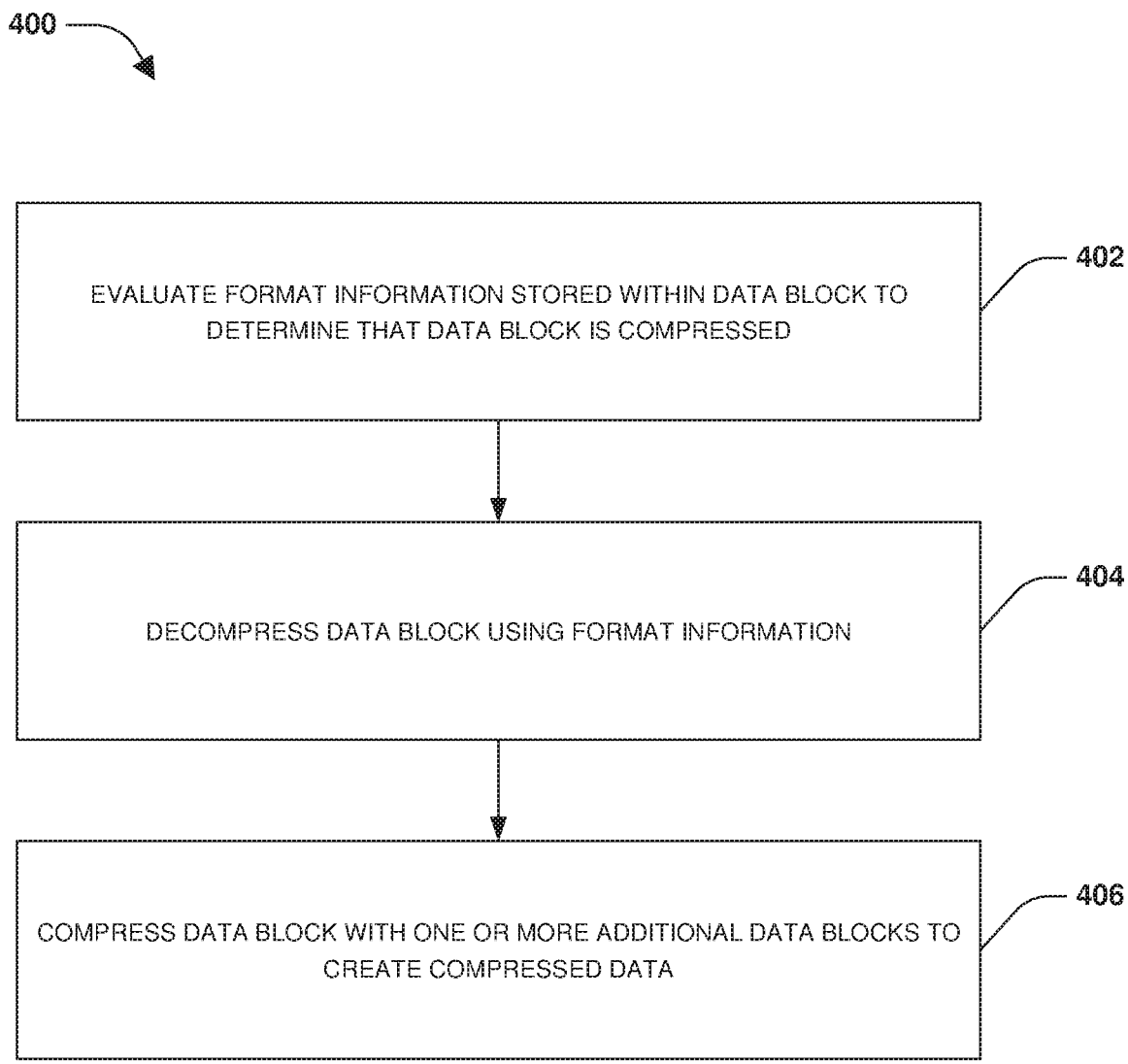
FIG. 4 is a flow chart illustrating an example method for implementing additional compression for existing compressed data.
Figure 5A:
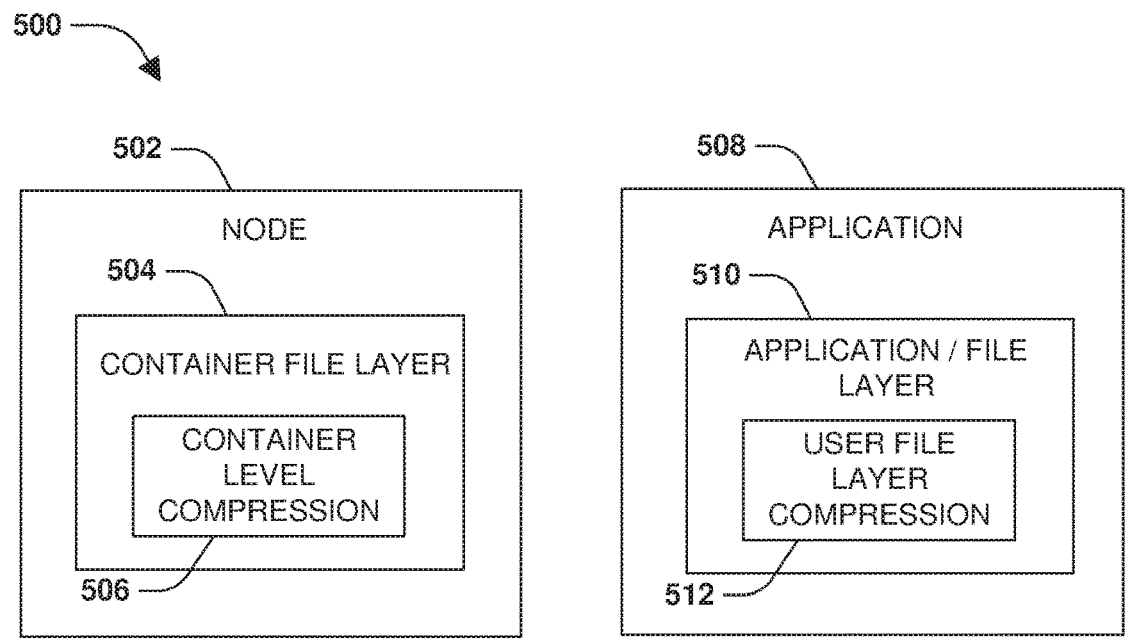
FIG. 5A is a block diagram illustrating an example system for implementing additional compression for existing compressed data.
Figure 5A:
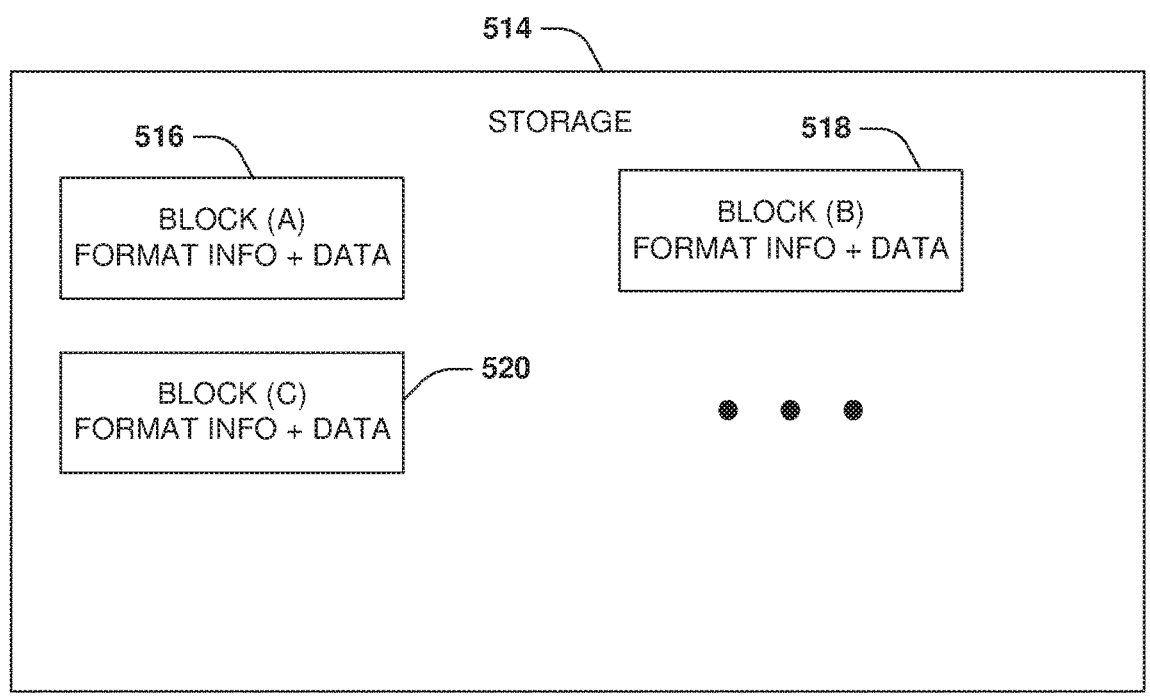

One embodiment of implementing additional compression for existing compressed data is illustrated by an exemplary method 400 of FIG. 4, which is further described in conjunction with system 500 of FIGS. 5A-5D. A node 502 may store data on behalf of client devices within storage 514, such as solid state drives, disk drives, memory, cloud storage, or a variety of other types of storage or combinations thereof, as illustrated by FIG. 5A. The data may be stored within disk blocks of physical storage, and may be organized by a file system for access by the client devices. For example, the node 502 may store data on behalf of an application 508. In an example, the application 508 may be hosted on a remote client device that connects to the node 502 and/or the storage 514 over a network. In another example, the application 508 may be hosted on the node 502 that is connected to the storage 514. The node 502 may be directly connected to the storage 514 or may be connected to the storage 514 over a network.

In an example, the node 502 may maintain data (A) within a block (A) 516 within the storage 514. The node 502 may maintain data (B) within a block (B) 518 within the storage 514. The node 5002 may maintain data (C) within a block (C) 520 within the storage. The block (A) 516, the block (B) 518, the block (C) 520, and/or other blocks within the storage 514 may correspond to disk blocks of physical storage within one or more storage devices. In an embodiment, the data (A), the data (B), and/or the data (C) may have been compressed by the application 508 before the data (A), the data (B), and/or the data (C) was written to corresponding files within the storage 514. For example, an application/file layer 510 may have utilized user file layer compression 512 to compress the data (A), the data (B), and/or the data (C) before the data (A), the data (B), and/or the data (C) was written to the storage 514. The user file layer compression 512 may comprise a relatively lighter-weight compression that consumes relatively less resources, processing power, and time to compress compared to other heavier-weight compression that can provide more compression storage savings than the lighter-weight compression, but consumes more resources, processing power, and/or time.

In another embodiment, the data (A), the data (B), and/or the data (C) may have been compressed at a file level (e.g., corresponding to the application/file layer 510) by combining and compressing some file blocks comprising the data (A), the data (B), and/or the data (C). In this way, the block (A) 516 is a compressed block (A) 516 comprising compressed data (A), the block (B) 518 is a compressed block (B) 518 comprising compressed data (B), and the block (C) 520 is a compressed block (C) 520 comprising compressed data (C). In an example, the compressed data (A), the compressed data (B), and/or the compressed data (C) may have been compressed at a user file layer, virtual volume layer, etc. (e.g., by the application/file layer 510).

In an embodiment, the compressed data (A), the compressed data (B), the compressed data (C), and/or other compressed data within the storage 514 may have been compressed using a first compression algorithm, such as the lighter-weight compression algorithm. The first compression algorithm may compress the data (A) to create the compressed data (A) (e.g., compress the block (A) 516 to create the compressed block (A) 516), the data (B) to create the compressed data (B) 518 (e.g., compress the block (B) 518 to create the compressed block (B) 518), and the data (C) to create the compressed data (C) (e.g., compress the block (C) 520 to create the compressed block (C) 520) according to a first compression format and/or first compression size utilized by the first compression algorithm. The layer, such as the application/file layer 510, that executes the first compression algorithm may store format information within the compressed block (A) 516, the compressed block (B) 518, and the compressed block (C) 520. That is, the layer may store format information for a compressed data block within an actual physical disk block comprising compressed data of the compressed data block, such as within a start of the physical disk block before the compressed data within the physical disk block.

In an example, format information (A) is stored within the compressed block (A) 516. The format information (A) may identify the first compression algorithm used to compress the compressed block (A) 516. The format information (A) may comprise information relating to how to decompress the compressed block (A) 516. The format information (A) may comprise information relating to how to compress the data (A) to obtain the compressed data (A) such as the compressed block (A) 516. Format information (B) is stored within the compressed block (B) 518. The format information (B) may identify the first compression algorithm used to compress the compressed block (B) 518. The format information (B) may comprise information relating to how to decompress the compressed block (B) 518. The format information (B) may comprise information relating to how to compress the data (B) to obtain the compressed data (B) such as the compressed block (B) 518. Format information (C) is stored within the compressed block (C) 520. The format information (C) may identify the first compression algorithm used to compress the compressed block (C) 520. The format information (C) may comprise information relating to how to decompress the compressed block (C) 520. The format information (C) may comprise information relating to how to compress the data (C) to obtain the compressed data (C) such as the compressed block (C) 520.

The node 502 may be configured with a container file layer 504 that can perform operations upon data within the storage 514 at a container level (e.g., a volume level or any other container level associated with a container within which files may be stored/contained). The container file layer 504 may be capable of performing container level compression 506. The container level compression 506 may compress data at a container level as opposed to at a user file or virtual volume level such as the user file layer compression 512. The container level compression 506 may provide a relatively heavier-compression than the lighter-weight compression provided by the user file layer compression 512. For example, the container level compression 506 may utilize a larger compression size (e.g., a larger chunk size) in order to provide additional compression storage savings than the user file layer compression 512 initially used to create the compressed block (A) 516, the compressed block (B) 518, and the compressed block (C) 520. However, the container level compression 506 may utilize more resources and/or time, but provides for improved storage efficiency.

Figure 5B:
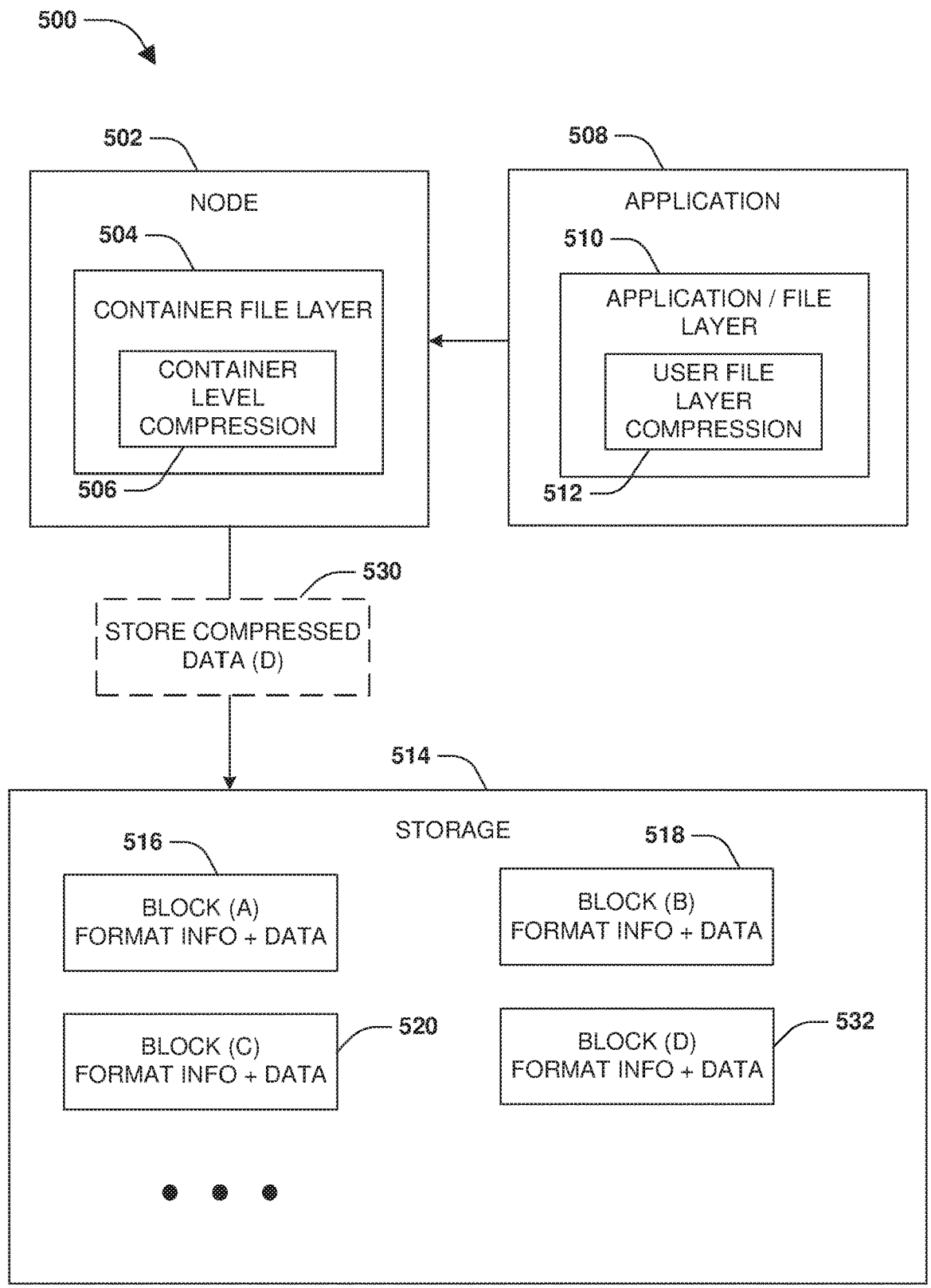
FIG. 5B is a block diagram illustrating an example system for implementing additional compression for existing compressed data, where compressed data (D) having a first compression format is written to storage.

The application 508, hosted on a client device, on the node 502, or other location, may write data directly to the storage 514 or write the data through the node 502 to the storage 514 (e.g., a write operation may be transmitted from the application 508 to the node 502, and the node 502 may execute the write operation upon the storage 514). For example, the application 508 may determine that data (D) is to be written to a file located within the storage 514, as illustrated by FIG. 5B. The application 508 may utilize the application/file layer 510 to implement the user file layer compression 512 upon the data (D) to create compressed data (D) that is compressed into a first compression format using a first compression algorithm. In an embodiment, the application 508 may store the compressed data (D) within the storage 514. In another embodiment, the application 508 may transmit the compressed data (D) to the node 502, and the node 502 may store 530 the compressed data (D) within the storage 514. The compressed data (D) may be stored within the storage 514 as a compressed block (D) 532 comprising the compressed data (D) and format information indicating that the first compression algorithm was used to compress the compressed data (D) along with other information indicating how to decompress the compressed data (D).

In order to achieve additional storage compression efficiency for reducing storage consumption within the storage 514, the existing compressed block (A) 516, the existing compressed block (B) 518, the existing compressed block (C) 520, the existing compressed block (D) 532, and/or other compressed data within the storage 514 that was compressed with the first compression algorithm into the first compression format (e.g., compressed by the application/file layer 510 using the user file layer compression 512 that implements the lighter-weight compression algorithm) are additionally compressed using a second compression algorithm. The second compression algorithm may correspond to the heavier-weight compression algorithm and/or larger compression size implemented by the container file layer 504 using the container level compression 506.

Figure 5C:
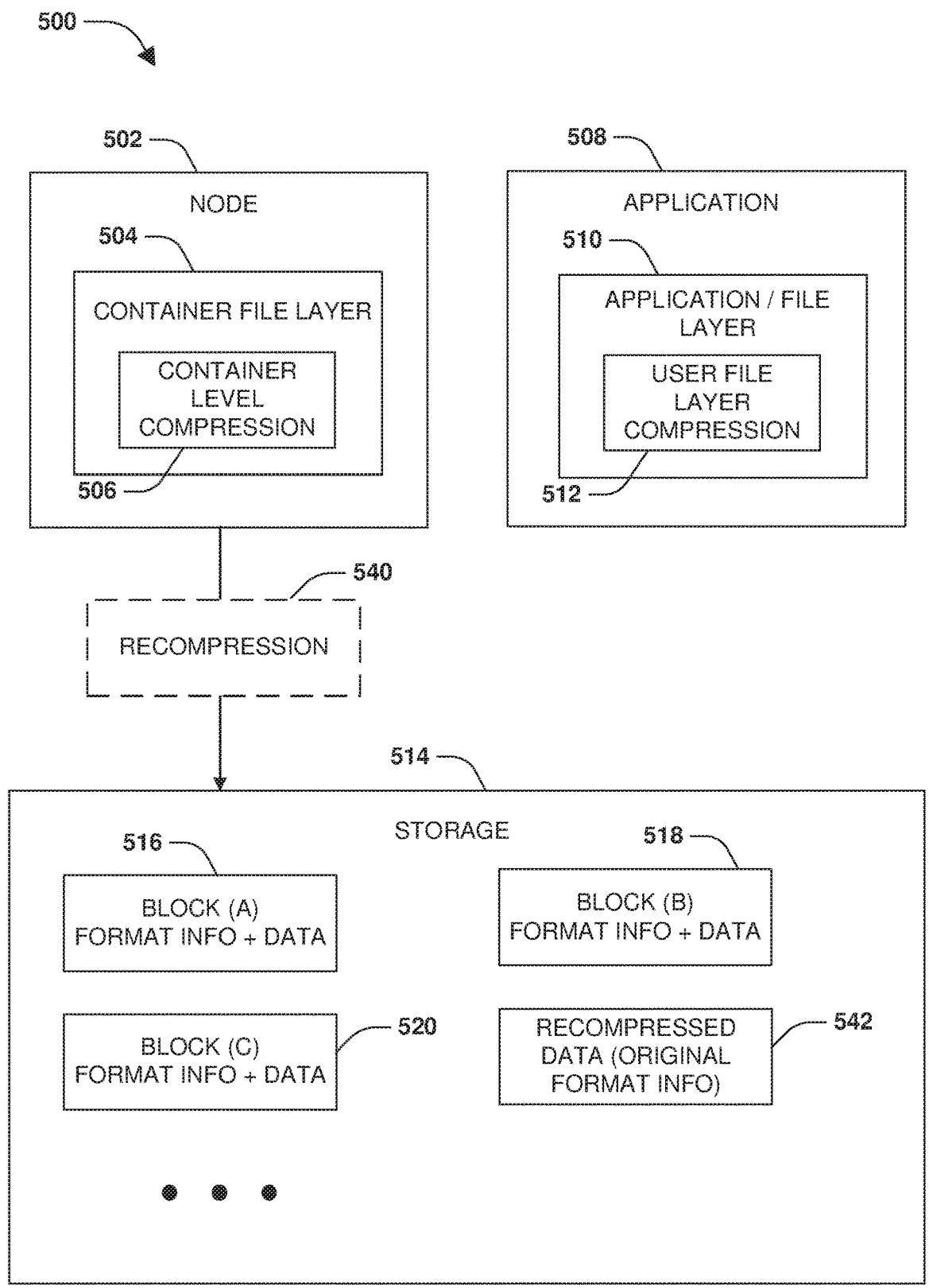
FIG. 5C is a block diagram illustrating an example system for implementing additional compression for existing compressed data, where compressed data (D) is recompressed according to a second compression format.

Accordingly, at 402, the node 502 may evaluate the compressed block (D) 532 to determine whether additional compression can be performed for the compressed block (D) 532, as illustrated by FIG. 5C. In particular, the node 502 may evaluate the format information stored within the compressed block (D) 532 to determine whether the compressed block (D) 532 is compressed or uncompressed. The format information may indicate that the compressed block (D) 532 is compressed. The format information may indicate that the first compression algorithm was used to compress the compressed block (D) 532. In an example, the compressed block (D) 532 may be determined, based upon the format information, to have been compressed by the application 508 using the first compression format. In an example, the compressed block (D) 532 may be determined, based upon the format information, to have been compressed at a file layer (e.g., the application/file layer 510 of the application 508) using the first compression format corresponding to the user file layer compression 512 (e.g., a user file layer compression format). The format information may comprise information indicating how to decompress the compressed block (D) 532. In an embodiment, the format information may be stored within a disk block (e.g., a physical disk block within the storage 514) comprising the compressed block (D) 532, such as within a start of the disk block before the compressed data (D) of the compressed block (D) 532.

At 404, the compressed block (D) 532 may be decompressed by the node 502 in response to the determination that the compressed block (D) 532 is compressed according to the first compression format by the first compression algorithm. The compressed block (D) 532 may be decompressed using the format information. For example, the compressed block (D) 532 may be compressed using information within the format information that indicates how to decompress the compressed block (D) 532. In this way, the compressed block (D) 532 is decompressed to obtain data (D) of block (D) in an uncompressed state.

At 406, the node 502 compresses (recompression 540) the data (D) of the block (D) with one or more other data blocks within the storage 514 to create compressed data (recompressed data 542) having a second compression format different than the first compression format of the compressed block (D) 532. In an example, the block (D) and the one or more other data blocks may be compressed together using a second compression algorithm different than the first compression algorithm used to compress the compressed block (D) 532. For example, the relatively lighter-weight compression algorithm may have been used by the application/file layer 510 of the application 508 to perform the user file layer compression to create the compressed block (D) 532. In contrast, the container file layer 504 of the node 502 may implement the container level compression 506 to compress the block (D) and the one or more other data blocks within the storage 514 according to a relatively heavier-weight compression algorithm to create the recompressed data 542 in the second compression format. In an embodiment, the block (D) and the one or more other data blocks within the storage 514 may be compressed using the second compression format at a storage layer of the node 502 to create the recompressed data 542 in the second compression format.

In an embodiment, the second compression format of the second compression algorithm used to create the recompressed data 542, which may utilize a second compression size that is different than a first compression size that was utilized by the first compression algorithm of the first compression format of the compressed block (D) 532. For example, the second compression size may be larger than the first compression size (e.g., a larger chunk of data may be compressed using the second compression size such as where not only the block (D) is being compressed, but the block (D) is being compressed with the one or more additional data blocks within the storage 514).

In an embodiment, the recompressed data 542 may retain any prior deduplication performed upon the data (D) (e.g., deduplication performed upon the compressed block (D) 532) and/or the additional data blocks that are recompressed with the data (D). For example, data within data blocks and compressed data blocks (e.g., data of the compressed block (A) 516, the compressed block (B) 518, the compressed block (C) 520, and the compressed block (D) 532) in the storage 514 may have been deduplicated to identify and remove redundant data by replacing duplicate instances of the same data with references to a single instance of the data in order to reduce storage utilization otherwise wasted in storing redundant data within the storage 514. When the compressed block (D) 532 is decompressed and recompressed as the recompressed data 542, any prior deduplication with respect to the compressed block (D) 532 may be retained within the recompressed data 542.

In an embodiment, the container file layer 504 of the node 502 may utilize the container level compression to retain compression information within the recompressed data 542. The compression information may correspond to and/or be derived from the format information that was included within the compressed block (D) 532. For example, the compression information may comprise information regarding the first compression format of the compressed block (D) 532. In an example, the compression information may comprise information about the first compression algorithm. In an example, the compression information may comprise information about the first compression size. In an example, the compression information may comprise information used to compress the data (D) back into the first compression format as the compressed block (D) 532. In an embodiment, the compression information may be stored within a disk block of the storage 514 at a start location of the disk block at a location occurring before the recompressed data 542 (e.g., a physical disk block of the storage 514 may comprise the compression information, and then comprise the recompressed data 542).

Figure 5D:
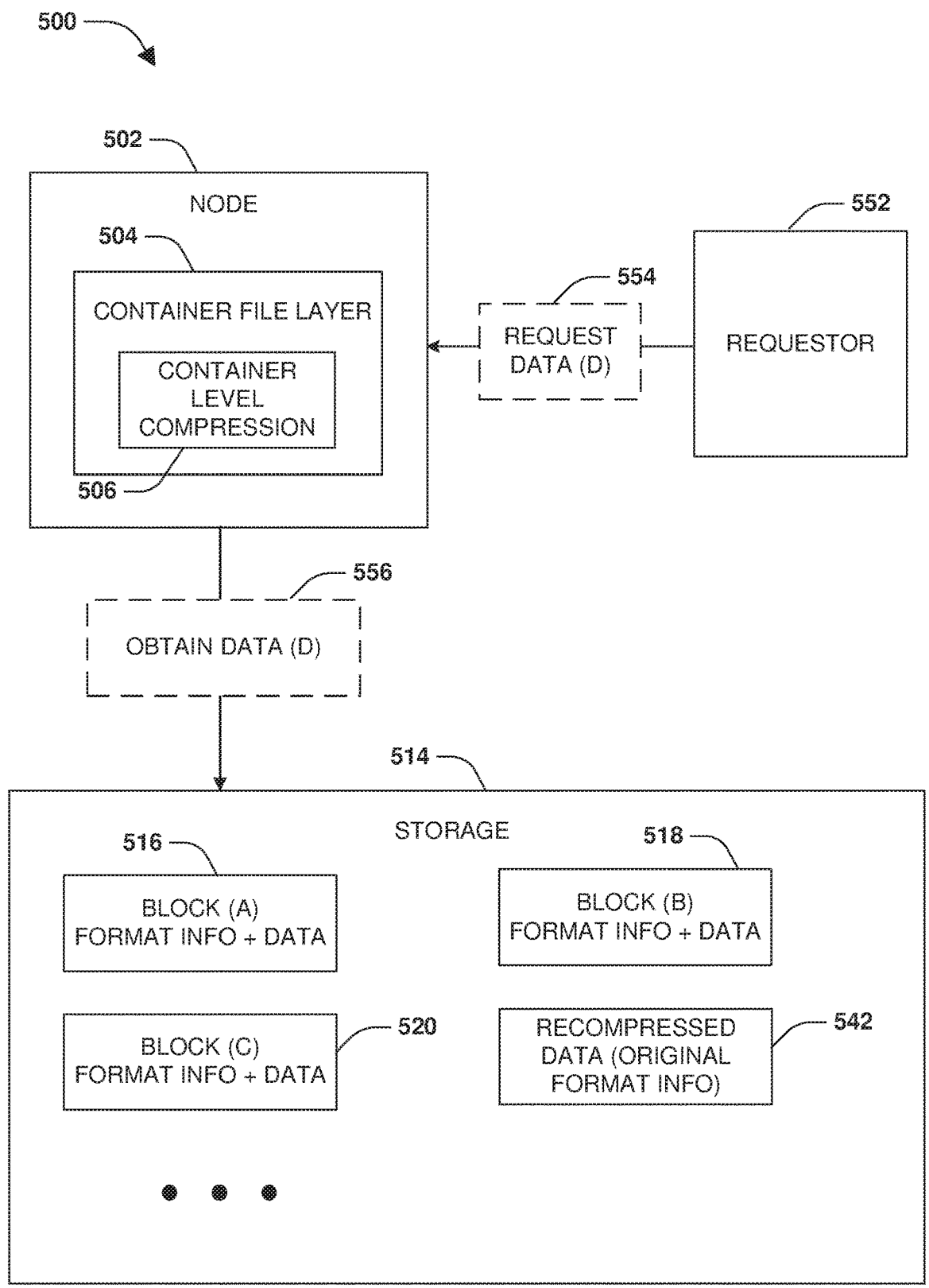
FIG. 5D is a block diagram illustrating an example system for implementing additional compression for existing compressed data, where recompressed data (D) is requested.

FIG. 5D illustrates a requestor 552 transmitting a request 554 to the node 502 for the data (D). In an example, the requestor 552 may comprise the application 508, a client device, or other entity requesting 554 the data (D) (e.g., a device attempting to read the data (D) of a file accessed by the device or to write to the data (D) of the file). Upon receiving the request 554 for the data (D), the node 502 accesses 556 the recompressed data 542 within the storage 514. In an embodiment, the node 502 may decompress the recompressed data 542 using the compression information in order to obtain the data (D) (the block (D)). The data (D) may be transmitted from the node 502 to the requestor 552 in an uncompressed format, along with an indication that the data (D) is no longer compressed. In another embodiment, the node may decompress the recompressed data 542 using the compression information in order to obtain the data (D) (the block (D)). The node 502 may utilize the compression information to recompress the data (D) (the block (D)) into the first compression format in order to obtain the compressed block (D) 532. The node 502 may transmit the compressed block (D) 532 to the requestor 552.

Figure 6:
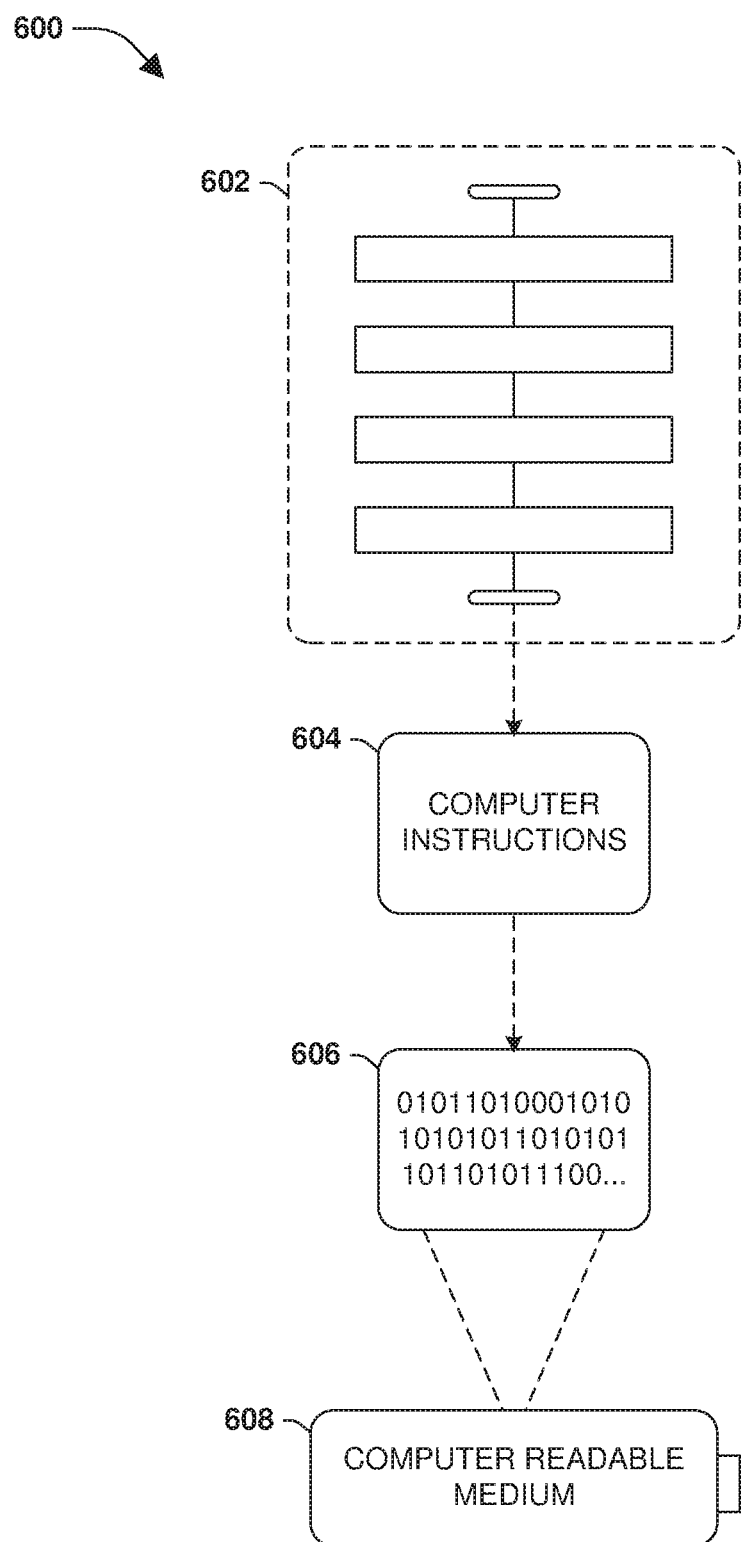
FIG. 6 is an example of a computer readable medium in which an embodiment of the invention may be implemented.

Still another embodiment involves a computer-readable medium 600 comprising processor-executable instructions configured to implement one or more of the techniques presented herein. An example embodiment of a computer-readable medium or a computer-readable device that is devised in these ways is illustrated in FIG. 6, wherein the implementation comprises a computer-readable medium 608, such as a compact disc-recordable (CD-R), a digital versatile disc-recordable (DVD-R), flash drive, a platter of a hard disk drive, etc., on which is encoded computer-readable data 606. This computer-readable data 606, such as binary data comprising at least one of a zero or a one, in turn comprises processor-executable computer instructions 604 configured to operate according to one or more of the principles set forth herein. In some embodiments, the processor-executable computer instructions 604 are configured to perform a method 602, such as at least some of the exemplary method 400 of FIG. 4, for example. In some embodiments, the processor-executable computer instructions 604 are configured to implement a system, such as at least some of the exemplary system 500 of FIGS. 5A-5D, for example. Many such computer-readable media are contemplated to operate in accordance with the techniques presented herein.

In an embodiment, the described methods and/or their equivalents may be implemented with computer executable instructions. Thus, in an embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on. In an embodiment, a computing device is implemented with one or more executable algorithms that are configured to perform any of the disclosed methods.

It will be appreciated that processes, architectures and/or procedures described herein can be implemented in hardware, firmware and/or software. It will also be appreciated that the provisions set forth herein may apply to any type of special-purpose computer (e.g., file host, storage server and/or storage serving appliance) and/or general-purpose computer, including a standalone computer or portion thereof, embodied as or including a storage system. Moreover, the teachings herein can be configured to a variety of storage system architectures including, but not limited to, a network-attached storage environment and/or a storage area network and disk assembly directly attached to a client or host computer. Storage system should therefore be taken broadly to include such arrangements in addition to any subsystems configured to perform a storage function and associated with other equipment or systems.

In some embodiments, methods described and/or illustrated in this disclosure may be realized in whole or in part on computer-readable media. Computer readable media can include processor-executable instructions configured to implement one or more of the methods presented herein, and may include any mechanism for storing this data that can be thereafter read by a computer system. Examples of computer readable media include (hard) drives (e.g., accessible via network attached storage (NAS)), Storage Area Networks (SAN), volatile and non-volatile memory, such as read-only memory (ROM), random-access memory (RAM), electrically erasable programmable read-only memory (EEPROM) and/or flash memory, compact disk read only memory (CD-ROM)s, CD-Rs, compact disk re-writeable (CD-RW)s, DVDs, cassettes, magnetic tape, magnetic disk storage, optical or non-optical data storage devices and/or any other medium which can be used to store data.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Furthermore, the claimed subject matter is implemented as a method, apparatus, or article of manufacture using standard application or engineering techniques to produce software, firmware, hardware, or any combination thereof to control a computer to implement the disclosed subject matter. The term "article of manufacture" as used herein is intended to encompass a computer application accessible from any computer-readable device, carrier, or media. Of course, many modifications may be made to this configuration without departing from the scope or spirit of the claimed subject matter.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, an application, or a computer. By way of illustration, both an application running on a controller and the controller can be a component. One or more components residing within a process or thread of execution and a component may be localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", or variants thereof are used, such terms are intended to be inclusive in a manner similar to the term "comprising".

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first set of information and a second set of information generally correspond to set of information A and set of information B or two different or two identical sets of information or the same set of information.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
    evaluating format information stored within a data block to determine whether the data block is compressed or uncompressed; and
    in response to the data block being compressed according to a first compression format:
        decompressing the data block using the format information; and
        compressing the data block with one or more other data blocks to create compressed data having a second compression format different than the first compression format.

2. The method of claim 1, comprising:
    evaluating the format information to identify a compression algorithm used to compress the data block.

3. The method of claim 1, comprising:
    evaluating the format information to identify information indicating how to decompress the data block.

4. The method of claim 1, wherein compressing the data block comprises:
    retaining deduplication of the data block.

5. The method of claim 1, comprising:
    retaining compression information regarding the first compression format of the data block, wherein the compression information is derived from the format information.

6. The method of claim 5, comprising:
    in response to receiving a request to read the data block, converting the data block into the first compression format using the compression information.

7. The method of claim 5, wherein the compression information is stored within a start of the compressed data stored in a disk block.

8. The method of claim 1, comprising:
    in response to receiving a request to read the data block, decompressing the compressed data to obtain the data block in an uncompressed state.

9. A non-transitory machine readable medium comprising instructions for performing a method, which when executed by a machine, causes the machine to:
    determine that a data block has been compressed using a first compression format;
    decompress the data block using format information indicating a compression algorithm used to compress the data block and information indicating how to decompress the data block; and
    compress the data block with one or more other data blocks to create compressed data having a second compression format different than the first compression format.

10. The non-transitory machine readable medium of claim 9, wherein the data block is determined to have been compressed by an application using the first compression format.

11. The non-transitory machine readable medium of claim 9, wherein the data block is determined to have been compressed at a file layer using the first compression format corresponding to a user file layer compression format.

12. The non-transitory machine readable medium of claim 9, wherein the data block is compressed using the second compression format at a container file layer.

13. The non-transitory machine readable medium of claim 9, wherein the data block is compressed using the second compression format at a storage layer.

14. The non-transitory machine readable medium of claim 9, wherein the first compression format corresponds to a first compression size and the second compression format corresponds to a second compression size different than the first compression size.

15. The non-transitory machine readable medium of claim 14, wherein the first compression size is smaller than the second compression size.

16. A computing device comprising:
    a memory comprising machine executable code for performing a method; and
    a processor coupled to the memory, the processor configured to execute the machine executable code to cause the processor to:
        determine that a data block has been compressed using a first compression algorithm;
        decompress the data block using format information corresponding to the first compression algorithm; and compress the data block with one or more other data blocks using a second compression algorithm to create compressed data.

17. The computing device of claim 16, wherein the first compression algorithm is different than the second compression algorithm.

18. The computing device of claim 16, wherein the first compression algorithm utilizes a first compression size and the second compression algorithm utilizes a second compression size.

19. The computing device of claim 18, wherein the first compression size is smaller than the second compression size.

20. The computing device of claim 16, wherein the machine executable code causes the processor to:
   in response to receiving a request to read the data block, decompress the compressed data to obtain the data block in an uncompressed state.

\* \* \* \* \*